United States Patent
Tsiang et al.

[11] Patent Number: 5,822,717
[45] Date of Patent: Oct. 13, 1998

[54] METHOD AND APPARATUS FOR AUTOMATED WAFER LEVEL TESTING AND RELIABILITY DATA ANALYSIS

[75] Inventors: Jerry Tsiang, Cupertino; Mikkel Lantz, Santa Clara; Yeng-Kaung Peng, Saratoga; Ying Shiau, San Jose, all of Calif.

[73] Assignee: Advanced Micro Devices, Inc., Sunnyvale, Calif.

[21] Appl. No.: 509,362

[22] Filed: Jul. 31, 1995

[51] Int. Cl.$^6$ .................................................. G01R 17/50
[52] U.S. Cl. ........................ 702/108; 438/17; 324/765; 324/719; 702/57
[58] Field of Search ........................ 364/578, 580, 364/579, 480–487, 551.01, 552, 554, 488–491, 468.17, 468.28; 438/14–18; 324/765–769, 719

[56] References Cited

U.S. PATENT DOCUMENTS

| | | | |
|---|---|---|---|
| 4,878,179 | 10/1989 | Larsen et al. | 364/490 |
| 5,206,582 | 4/1993 | Ekstedt et al. | 324/73.1 |
| 5,298,433 | 3/1994 | Furuyama | 437/8 |
| 5,355,320 | 10/1994 | Erjavic et al. | 364/488 |
| 5,390,129 | 2/1995 | Rhodes | 364/480 |
| 5,475,618 | 12/1995 | Le | 364/551.01 |
| 5,511,005 | 4/1996 | Abbe et al. | 364/552 |
| 5,557,559 | 9/1996 | Rhodes | 364/580 |
| 5,598,341 | 1/1997 | Ling et al. | 364/468.17 |

FOREIGN PATENT DOCUMENTS 2114185  4/1990  Japan .

OTHER PUBLICATIONS

EDN Electrical Design News, "Networked Automatic Test Equipment Improves Manufacturing Efficiency" pp. 47–56, vol. 28, No. 5, Mar. 1983, Newton, Massachusetts U.S.

*Primary Examiner*—James P. Trammell

[57] ABSTRACT

Methods and apparatus are disclosed for testing integrated circuits at the wafer level and for integrating test results, calculation of lifetimes and generation of trend charts in a common database following testing. A wafer tester controller is supplemented with additional hardware and software to avoid data transfer errors and facilitate processing and storage of test results. The data base is available over a network to all areas of an organization.

10 Claims, 6 Drawing Sheets

METHOD AND APPARATUS FOR AUTOMATED WAFER LEVEL TESTING AND RELIABILITY DATA ANALYSIS

TECHNICAL FIELD

The invention is directed to the field of integrated circuit fabrication and more particularly to the field of testing integrated circuits fabricated on a semiconductor wafer, prior to dicing of the wafer.

BACKGROUND ART

In the prior art, semiconductor devices such as integrated circuits, are fabricated starting with the wafer of crystalline silicon. The purity of the wafer is high. Components of an integrated circuit, such as resistors, transistors, diodes, et cetera are formed by selectively introducing impurities into portions of the surface of the silicon wafer and by adding various layers of materials having different characteristics on the surface of the wafer. A multiple layer device is thus created. The multiple layers include semiconductor layers, insulating layers and conductive layers linking the various regions of the components of the integrated circuit device.

Complex devices can be created by carefully defining the regions which are exposed to the various steps of fabrication using physical and chemical masks.

It is economical to replicate the set of masks needed for fabrication of a particular device or integrated circuit so that many integrated circuits can be formed simultaneously on a single wafer. FIG. 1a shows such a wafer. Of the devices formed on the wafer, some might be defective. Testing of all or selected devices on a particular wafer is needed to ensure the reliability of the end devices. This is frequently done using automatic test apparatus.

Figure 1:
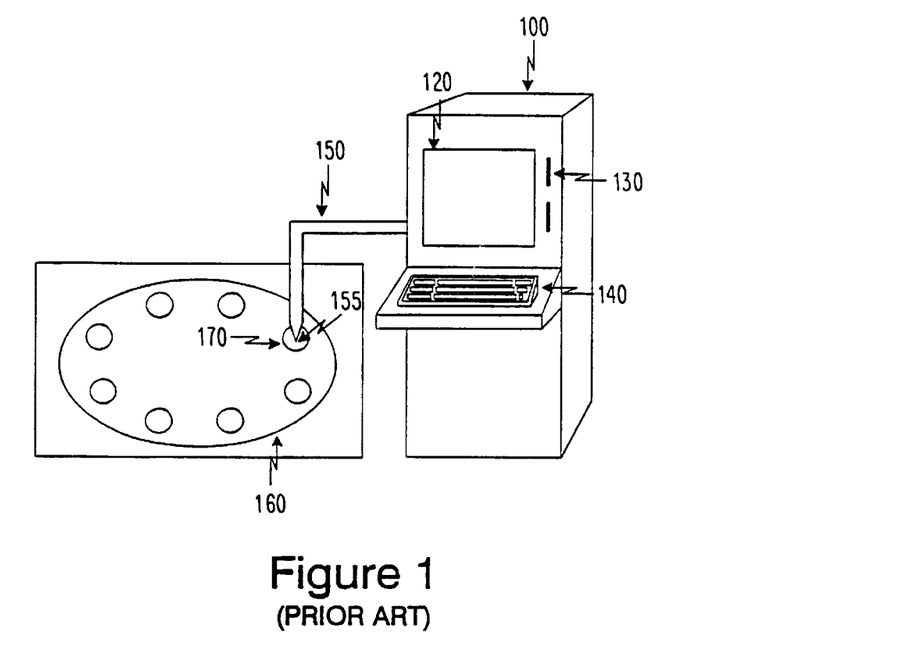
FIG. 1 is an illustration of automatic test apparatus of the prior art.
Figure 1A:
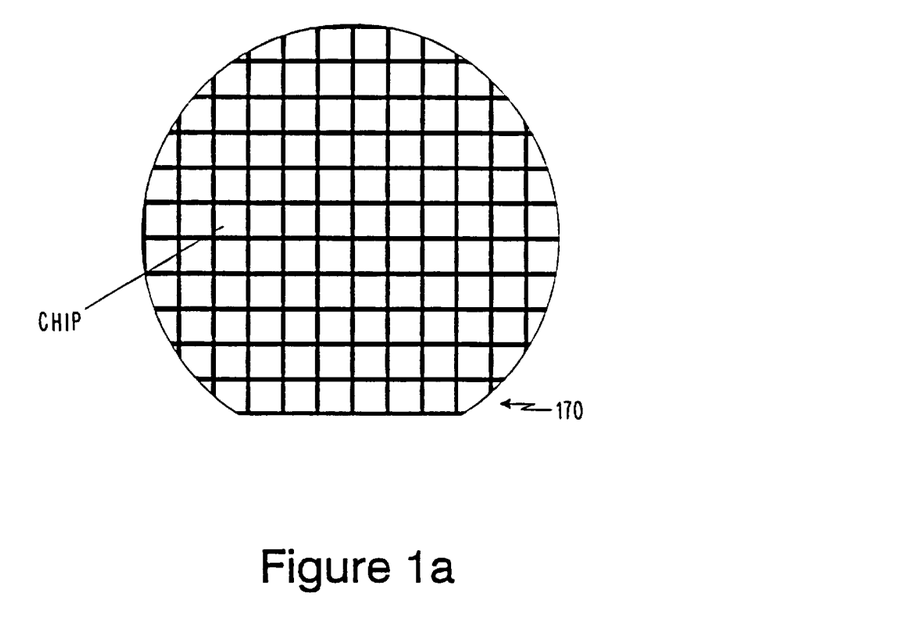
FIG. 1a is a representation of a silicon wafer with certain integrated circuits fabricated thereon.
Figure 2:
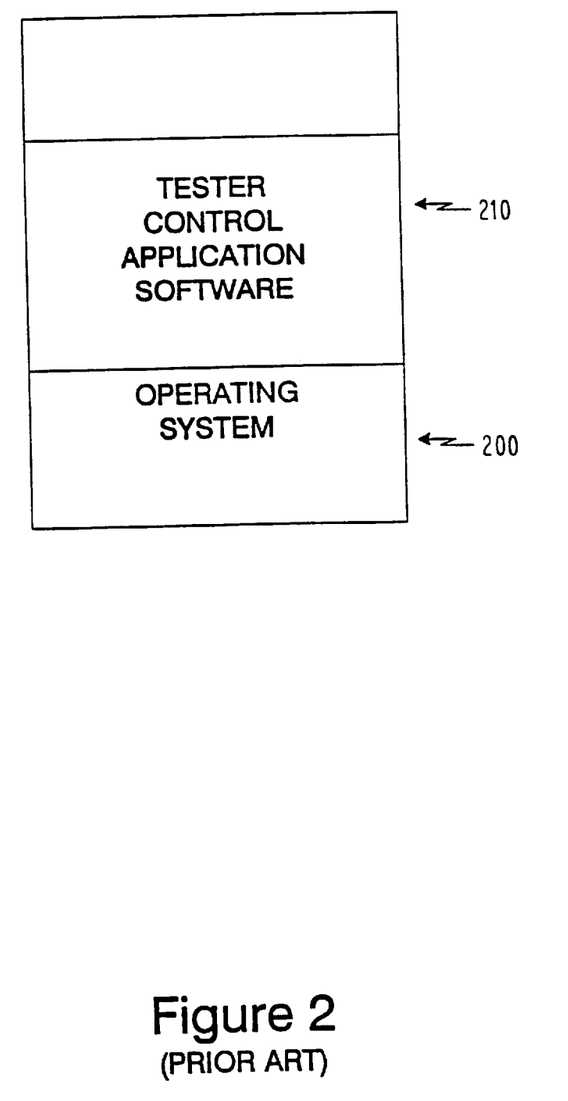
FIG. 2 is a representation of the software suite utilized with automatic test apparatus of the prior art.

FIG. 1 is an illustration of automatic test apparatus of the prior art. The apparatus comprises a wafer tester 100 and a wafer presentation system 160. Wafer tester 100 has an automatic test probe 155 controlled by a positioning mechanism 150 which operates under control of a tester controller mounted within the cabinet of the wafer tester. The tester controller incorporates a computer with an input device, such as keyboard 140, disc drives 130, and a visual display 120. The tester controller is loaded with software such as operating system 200 and tester control application software 210, both shown in FIG. 2. The tester control application software controls the location of positioning arm 150 to place the automatic test probe 155 over the precise point on the wafer where tests are to be conducted. The probe is then lowered into contact with the wafer, measurements are made and recorded, and the automatic test probe positioned to a point on the wafer where the next measurement is to be taken. Wafers may be tested one at a time or positioned on a presentation mechanism 160, such as a carousel where wafers may be rotated sequentially to positions within the reach of positioning arm 150 and its probe. Each wafer 170 contains a plurality of semiconductor devices, such as integrated circuits, each of which is to be tested. The tester controller sequences the test probe through the positions needed to make a test on each integrated circuit on the wafer. This may be done by taking one measurement from each of the integrated circuits on the wafer before progressing to a second measurement to be taken from each of the integrated circuits on the wafer or, alternatively, all measurements for an integrated circuit can be taken at one time before moving on to the next integrated circuit of the wafer.

In the prior art, data captured by wafer tester 100 was extracted, moved to a personal computer class of device where the data was analyzed and certain calculations performed, including calculation of an estimate of the lifetime of the integrated circuit associated with the set of measurements. The results of the analysis, including the expected life time of an integrated circuit were entered into a data base which could be widely accessed throughout the organization.

The testing of the prior art had several deficiencies. First, test results from the tester controller were printed and manual calculations were performed. Alternatively, test results were manually entered into a standard personal computer class device and the various calculations were calculated by the computer. Next the test results and calculation results were transferred to a central database. This increased the chance for error in data transfer.

Another problem with the prior art was that the data analysis and calculations were done in a device separate from the wafer tester.

DISCLOSURE OF THE INVENTION

The problems of the prior art are overcome in accordance with the invention by providing a wafer tester with expanded functionality and by providing a network connection between one or more tester controllers and an organizational data base.

Accordingly, one advantage of the invention resides in the ability to capture data, analyze data and to cause both the collected data and the results of the analysis to be entered into an organizational data base from a single device.

Another advantage of the invention resides in the ability to retain raw measurement data with minimal effort and improved accuracy so that the raw data can be available for future calculations.

Another advantage of the invention is that the calculation results as well as raw data are globally accessible throughout an organization over a network.

Another advantage of the invention is the provision of a wafer tester with expanded functionality.

Another advantage of the invention is the ability of one tester connected to a network to interact with and, if desirable, control other testers over the network.

Another advantage resides in storing a computer program for implementing wafer testing in accordance with the invention on a computer readable diskette or memory.

These and other advantages of the invention are achieved by providing a wafer testing system having a network, a wafer tester with an automatic test probe and a tester controller connected to a network and a database connected to the network receiving test results from the wafer tester. The system includes analysis software on the tester controller for processing test results to derive a predicted lifetime for each integrated circuit on a wafer being tested. The results of the lifetime calculation are written to the database over the network. The system, in accordance with one embodiment of the invention, implements a lifetime calculation as follows:

Collecting breakdown voltages of capacitors at 2 stress conditions,

Sorting breakdown voltages in increasing order and plot cumulative failure percent versus breakdown voltages for each condition, Finding breakdown difference ($\Delta V$) between 2 stress conditions at different failure percents, Finding beta values at different failure percentages using: at 3%, 6% . . .

where $\beta = -\frac{d \log t}{dV}$ ;

Finding the smallest value of beta and also breakdown voltage value at 5% failure, and Calculate lifetime at failure rate of 5%, using:

$$\log(t) - \log 0.03 + \beta(BV_{5\%} - X),$$

where

X is the operating voltage of device being tested.

A plurality of wafer testers may be connected to the network and each may monitor wafers containing different types of integrated circuits.

The invention is also directed to a method of automatically testing integrated circuits fabricated on a wafer using a wafer tester by probing selected points on each integrated circuit of a wafer to measure one or more electrical values, storing the values with data identifying the integrated circuit and wafer at the wafer tester, processing the values to produce an estimate of lifetime for the integrated circuit at the wafer tester, and storing the estimate of lifetime together with the values at a location remote from the wafer tester over a network.

The invention is also directed to a computer readable diskette or memory having stored thereon a computer program for implementing the method described immediately above.

Still other objects and advantages of the present invention will become readily apparent to those skilled in the art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

A wafer tester such as that shown in FIG. 1 as item 100 is modified to have additional software and hardware compared to the prior art configuration. Preferably, the wafer tester is one marketed by Keithley Instruments of Cleveland Ohio under model designation S900. The model S900 device is modified beyond the configuration shown in FIG. 2 by integrating numerical analysis software such as that designated RS1 and manufactured by Borland International of Scotts Valley, Calif. The test or hardware is modified by including a line card for connection to a network. The line card would, of course, be compatible with the network to which it is attached. Examples of networks suitable for handling communications between wafer testers and an organizational data base would include TCP/IP networks, token ring networks, and many other common digital or analog networks.

Figure 3:
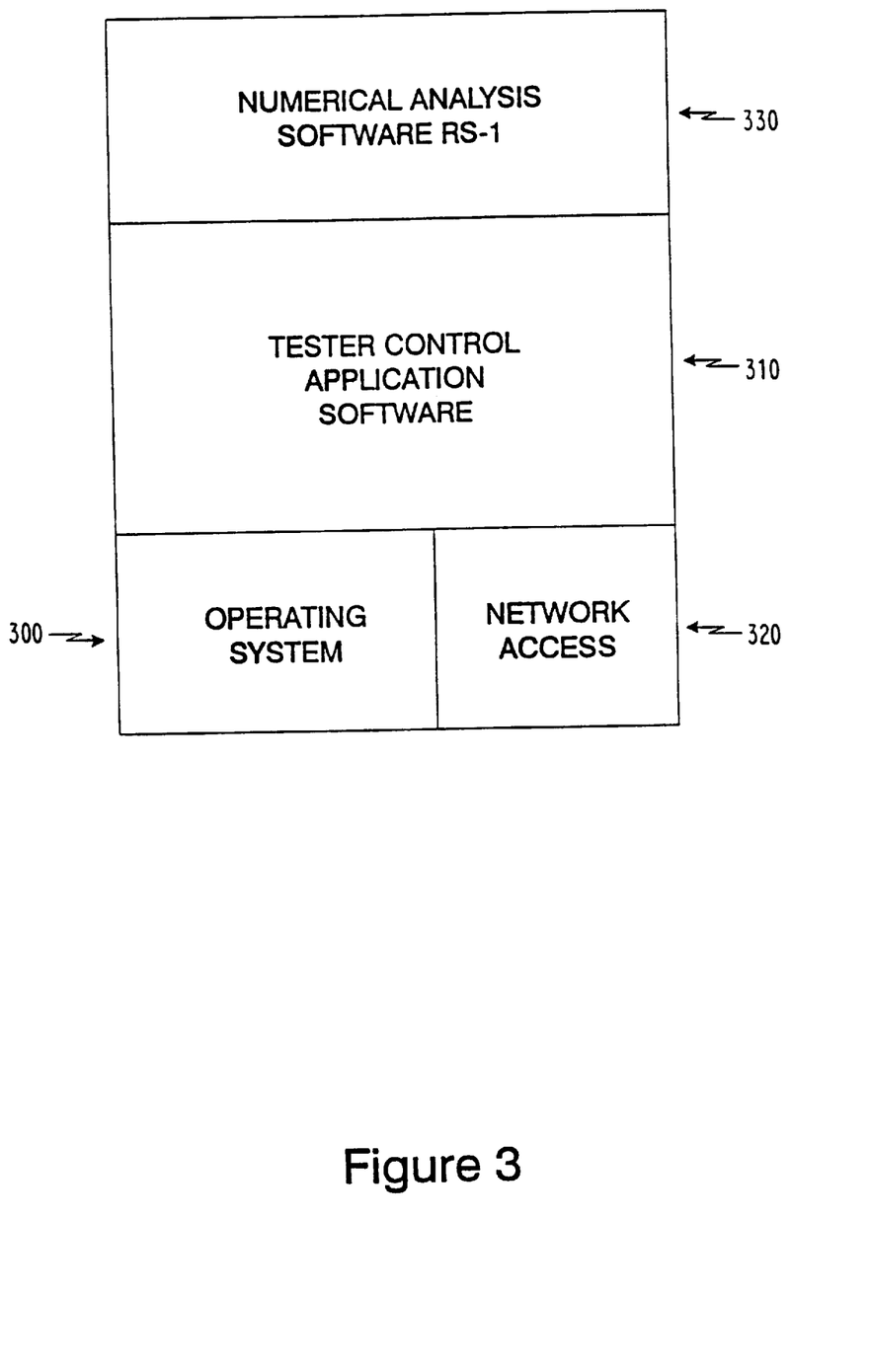
FIG. 3 is a representation of the software suite of automatic test apparatus in accordance with the invention.

The software suite used in accordance with the invention is depicted in FIG. 3. Network access software, utilized to drive the line card and facilitate communications across the network is, of course, loaded on to the system. Such software is shown in the software suite of FIG. 3 as network access software 320. The numerical analysis software is shown in the same figure at 330. The installation and porting of the software to the network so as to permit access to the remote data base over the network is well known in the art and easily accomplished.

Figure 4:
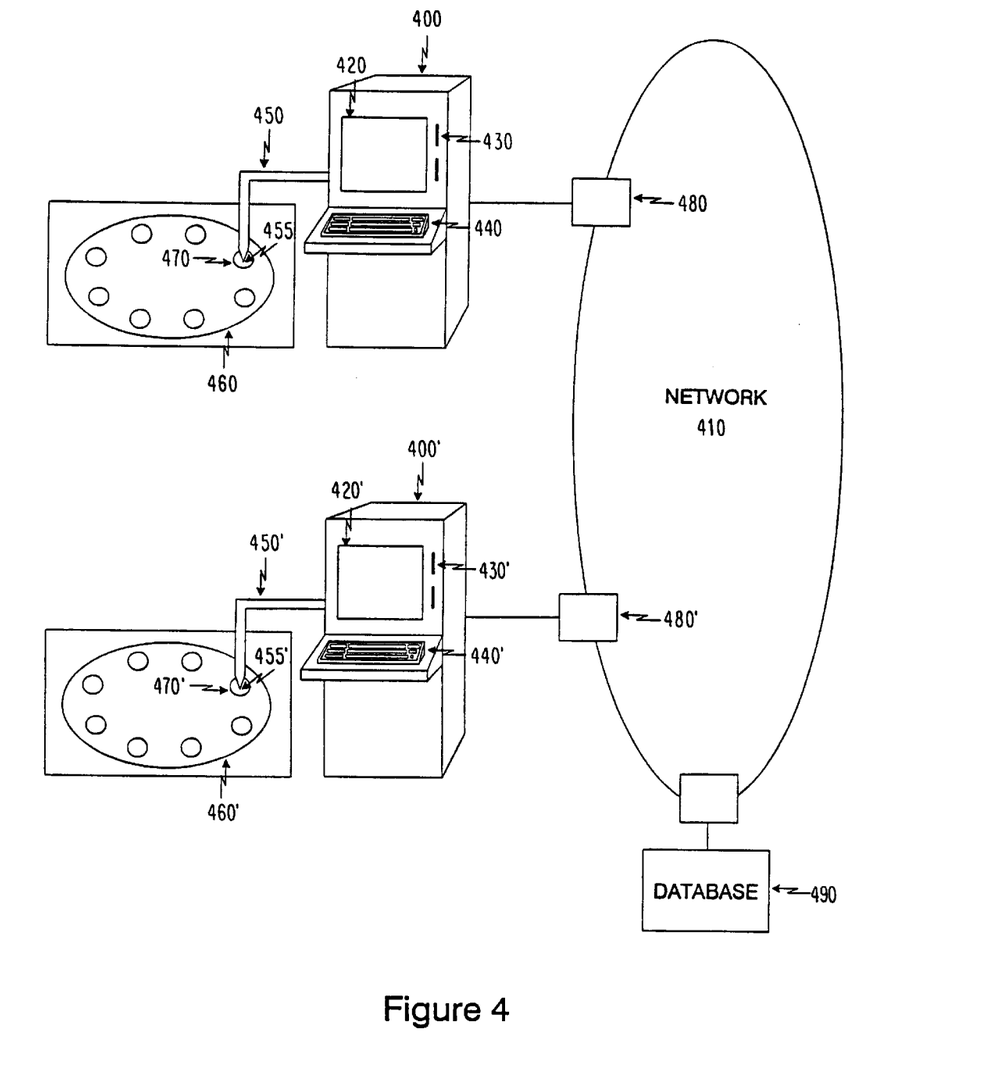
FIG. 4 is an illustration of a plurality of automatic test apparatus connected over a network to a common data base in accordance with the invention.

FIG. 4 illustrates a network arrangement in which multiple wafer testers modified in accordance with the invention are connected to ports on a network, which network also services data base 490. Each of wafer testers 400 and 400' is set up with the hardware and software complement described above. Network interface units 480 and 480' are shown symbolically in FIG. 4 and although depicted separately are normally part of the network line card resident on the mother board of the wafer tester controller.

Figure 5:
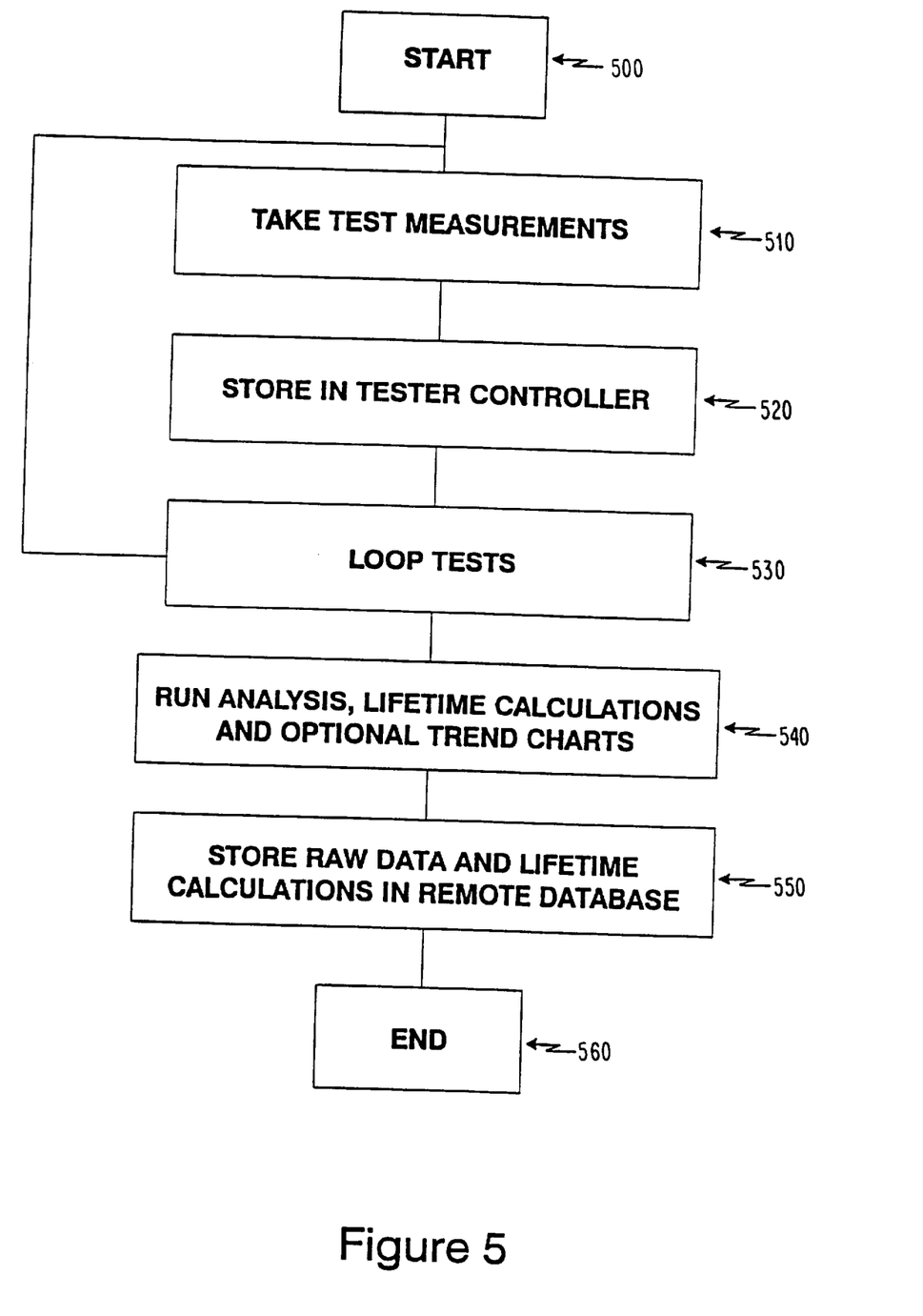
FIG. 5 is a flow chart of the processing of test data gathered by automatic test apparatus to produce a predicted lifetime.

FIG. 5 is a flow chart of the processing of the data gathered by the automatic test apparatus. Starting at block 500, the automatic test probe is directed to take test measurements at (510) and store the results in the tester controller (520). At 530, one or more loop tests are conducted, depending on the order in which the tests are to be taken to ensure that all data is gathered. In one alternative, a single test is taken from each IC on the wafer prior to taking a different test from each IC on the wafer. In an another alternative, all tests for one IC are taken before moving to the next IC. The particular loop tests implemented at step 530 are those designed to implement the particular testing order desired. At step 540, an analysis of the data runs is undertaken, lifetime calculations prepared and optionally trend charts generated. The raw data and the lifetime calculations are then stored in a remote data base, (550) and the procedure ends.

Figure 6:
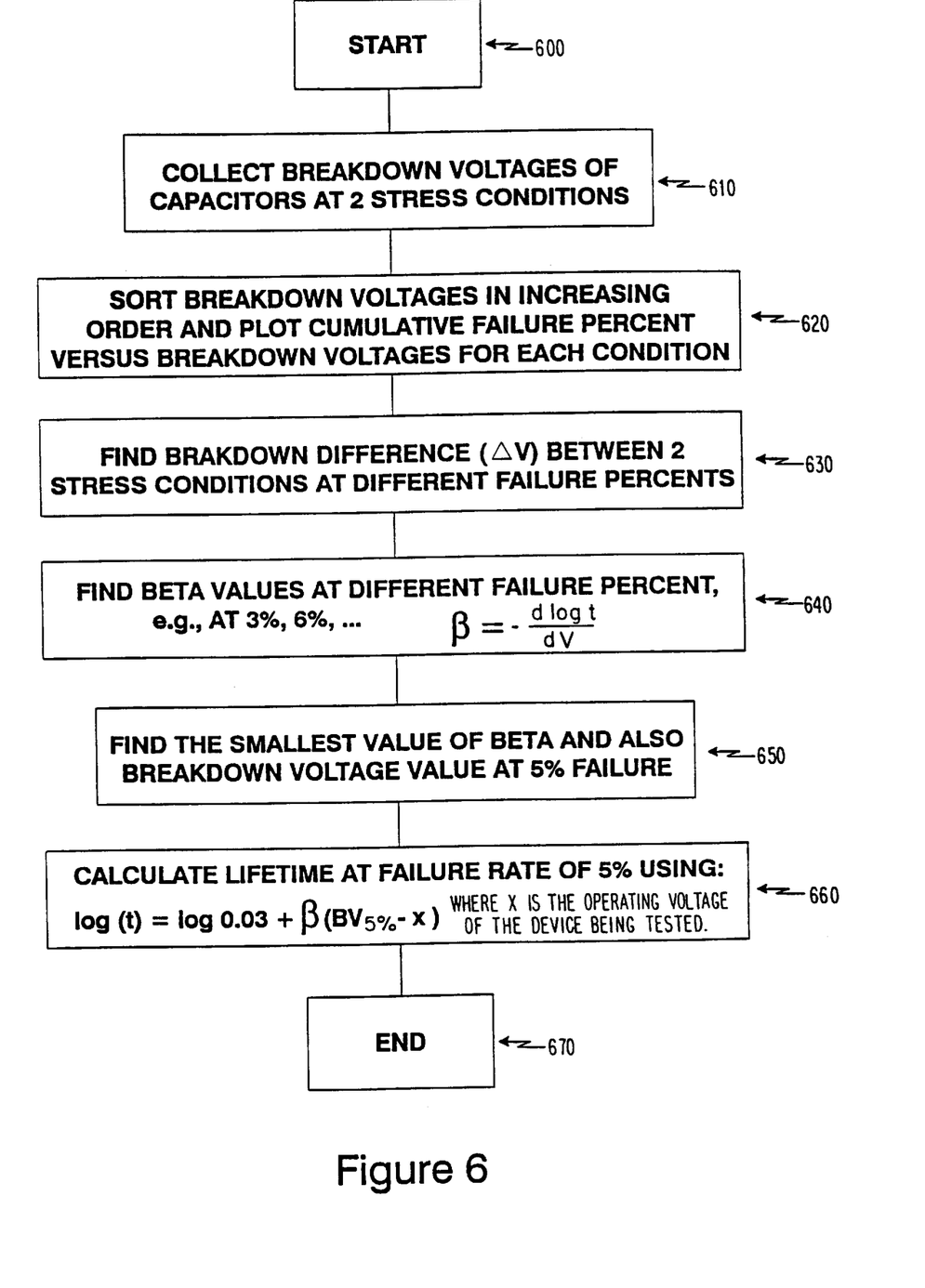
FIG. 6 is a flow chart of a lifetime calculation from a Voltage Ramp Dielectric Breakdown Voltage Test (VRDB).

One typical lifetime calculation, and in fact the preferred calculation is shown in FIG. 6. A Voltage Ramp Dielectric Breakdown Voltage Test (VRDB) is used to evaluate the reliability of gate oxide. Voltage was ramped up at a step of 0.2 volt at 2 time intervals, 30 and 300 milliseconds, until the current reaches 10 miliamps, destructive breakdown. From the breakdown voltage shifts between the two time intervals, beta values and lifetimes are calculated in accordance with the following.

Collecting breakdown voltages of capacitors at 2 stress conditions,

Sorting breakdown voltages in increasing order and plot cumulative failure percent versus breakdown voltages for each condition, Finding breakdown difference ($\Delta V$) between 2 stress conditions at different failure percents, Finding beta values at different failure percentages using: at 3%, 6% . . .

$$\text{where } \beta = -\frac{d \log t}{dV} \; ; (640)$$

Finding the smallest value of beta and also breakdown voltage value at 5% failure, and
Calculate lifetime at failure rate of 5%, using:

$$\log(t) - \log 0.03 + \beta(BV_{5\%} - X) \; (660),$$

where

X is the operating voltage of device being tested.

Another calculation for lifetime can be based on the hot carrier injection test. In this test, the peak substrate current is measured for a fixed source to drain voltage (preferably the operating voltage of the devuce under test) as a function of a scanned gate voltage for N and P- channel devices. The algorithm for calculating lifetime using the hot carrier injection test is:

| For N-channel | Life = A $(Isub)^{-n}$ |
|---|---|
| For P-channel | Life = A $(Igate)^{-n}$. |

Vt (threshold) fluence tests are used to investigate the charge trapping characteristics of transistors. In this test, a constant current of 1 nA is applied to a gate (positive) for 200 seconds. Vt is measured before the stress and at intervals of 20 seconds until 200 seconds have elapsed. N-channel and P-channel transistors with particular gate widths and gate lengths without diode protection on scribe line monitors are tested. The Vt shift is defined as the difference of Vt values after 200 second stressing, and Vt value prior to stressing.

The preferred tests and variables measured or used by the automatic test equipment include: hot carrier injection (substrate currents at maximum gate voltage, average value, standard deviation, M factor (where the M factor equals $I_{substrate}/I_{drain}$), and lifetimes (voltage ramp dialectic breakdown) breakdown voltages and destruction current level, average value, standard deviation, mode A %, B %, C %, beta value and lifetimes ($V_t$ fluence threshold voltages and its shifts) and isothermal test (actual time to fail, initial resistance, and lifetimes).

Samples of numerical processing results of calculations in accordance with the invention are set forth in tables 1–3 to the specification. Annotations describe the meanings of entries in the tables.

The system described in this disclosure permits automated wafer level reliability test data analysis and calculations which offer greater flexibility and expanded functionality over that provided by the prior art.

In this disclosure, there is shown and described only the preferred embodiment of the invention, but as aforementioned, it is to be understood that the invention is capable of use in various other combinations and environments and is capable of changes or modifications within the scope of the inventive concept as expressed herein.

| | | | | |
|---|---|---|---|---|
| HCI Summary for Fathom Rev: 1.057 | Lot: C044454 | | Device: 5972CW Date: 07-20-1994 18:36:40 | |
| Station: SDCS93 Operator 76753 | Operation: | | 9461 Test Plan: H5971A.FTM Rev: 0.000 | |
| | 50/0.7 | 50/0.7 | | ← DIMENSION OF TRANSISTOR |
| N-CHANNEL → | N PKIS | P PKIS | | ← P-CHANNEL PEAK SUBSTRATE CURRENTS |
| LOT NO. LIFES # | | | | |
| ↓         ↓ | | | | |
| C044454 05 | 281.0f | 2.300E-21 | } | ← PARAMETER FOR LIFETIME CALCULATION |
| N | -3.820 | -2.210 | | |
| Mean AVERAGE SUBSTRATE CURRENT | -160.3u | 1.366u | | |
| Count NO. OF DICE TESTED | 30.00 | 30.00 | | |
| Current | 160.3u | 64.05p | | ← FOR P-CHANNEL CONVERTED TO GATE CURRENT |
| Life | 88.33 | 77.50 | | ← LIFETIMES IN YEARS |
| C044454 14 | 281.0f | 2.300E-21 | | |
| N | -3.820 | -2.210 | | |
| Mean | -200.6u | 1.538u | | |
| Count | 9.000 | 30.00 | | |
| Current | 200.6u | 73.96p | | |
| Life | 37.51 | 56.39 | | |

| | | LOT # | WAFER | | |
|---|---|---|---|---|---|
| | | ↓ | ↓ | | |
| Lot = C044454 | Wafer = C044454 | 10 | | | |
| Site , | NX-5Y4 , | NX-5Y2 , | NX-5Y0 | ← DIE LOCATION N-CHANNEL | |
| Initial , | 0.6673 , | 0.6701 , | 0.6546 | ← THRESHOLD VOLTAGE | |
| 0 , | 0.000 , | 0.000 , | 0.000 | | |
| 200 , | 0.9872 , | 0.9552 , | 1.004 | ← THRESHOLD VOLTAGE AFTER 200 SEC STRESS | |
| Lot = C044454 | Wafer = C044454 | 10 | | | |
| Site , | NX-5Y3 , | NX-5Y1 , | NX-5Y-1 | | |
| Initial , | 0.6544 , | 0.6351 , | 0.6722 | | |
| 0 , | 0.000 , | 0.000 , | 0.000 | | |
| 200 , | 0.9340 , | 1.072 , | 0.9013 | | |
| Lot = C044454 | Wafer = C044454 | 10 | | | |
| Site , | PX-5Y4 , | PX-5Y2 , | PX-5Y0 | ← DIE LOCATION P-CHANNEL | |
| Initial , | -0.8484 , | -0.8382 , | -0.8283 | | |
| 0 , | 0.000 , | 0.000 , | 0.000 | | |
| 200 , | 0.1441 , | -2.489 m , | -27.03 m | | |
| Lot = C044454 | Wafer = C044454 | 10 | | | |
| Site , | PX-5Y3 , | PX-5Y1 , | PX-5Y-1 | | |

-continued

| | | | |
|---|---|---|---|
| Initial, | −0.8343, | −0.8072, | −0.8318 |
| 0, | 0.000, | 0.000, | 0.000 |
| 200, | 0.1165, | −21.28 m, | 62.45 m |

TABLE

| TYPE OF CAPACITOR | 30 MILLISECOND STRESS | | | | WAFER | |
|---|---|---|---|---|---|---|
| | # VRDB Summary Lot = C446G60 | | Wafer = C446G60-02 | | Test Plan = V98161B.FTM | |
| | ,P2PA 30 ms | ,300 | ,P2NWA 30 ms | ,300 | ,P2NWE 30 ms | ,300 |
| DICE TESTED Cnt, | 26.00, | 25.00, | 20.00 | 17.00, | 25.00, | 24.00, |
| AVERAGE BV Ave, | 20.89, | 20.77, | 16.58, | 20.91, | 20.48, | 20.82, |
| STANDARD DEV. Stdv. | 0.6202, | 0.6342, | 0.8531, | 0.6637, | 0.2455, | 0.1660, |
| MODE A % Amod, | 0.000, | 0.000, | 0.000, | 0.000, | 0.000, | 0.000, |
| MODE B % Bmod, | 0.000, | 4.000, | 30.00, | 52.94, | 0.000, | 8.333, |
| MODE C % Cmod, | 11.54, | 12.00, | 5.000, | 5.882, | 0.000, | 0.000, |
| Beta, | @ | 50.00, | 1.250@ | 50.00, | 1.667@ | 50.00, |
| Life, | @ | 19.20, | 15.61@ | 18.40, | 24.65@ | 20.60, |
| | # VRDB Summary Lot = C446G60 | | Wafer = C446G60-05 | | Test Plan = V98161B.FTM | |
| | ,P2PA 30 ms | ,300 | ,P2NWA 30 ms | ,300 | ,P2NWE 30 ms | ,300, |
| Cnt, | 26.00, | 26.00, | 26.00, | 26.00, | 25.00, | 26.00, |
| Ave, | 21.28, | 21.02, | 21.69, | 20.95, | 20.35, | 20.76, |
| Stdv, | 0.3923, | 0.3146, | 0.2137, | 0.2300, | 0.2828, | 0.1502, |
| Amod, | 0.000, | 0.000, | 0.000, | 0.000, | 0.000, | 0.000, |
| Bmod, | 0.000, | 0.000, | 0.000, | 0.000, | 0.000, | 0.000, |
| Cmod, | 3.846, | 3.846, | 0.000, | 0.000, | 0.000, | 0.000, |
| Beta, | 2.500@ | 50.00, | 1.667@ | 50.00, | 2.500@ | 50.00, |
| Life, | 37.23@ | 20.60, | 24.65@ | 20.60, | 37.23@ | 20.60, |
| | # VRDB Summary Lot = C446G60 | | Wafer = C446G60-20 | | Test Plan = V98161B.FTM | |
| | ,P2PA 30 ms | ,300 | ,P2NWA 30 ms | ,300 | ,P2NWE 30 ms | ,300 |
| Cnt, | 26.00, | 25.00, | 22.00, | 21.00, | 25.00, | 26.00, |
| Ave, | 21.63, | 20.83, | 19.10, | 20.98, | 21.24, | 20.71, |
| Stdv, | 1.217, | 0.9105, | 0.1720, | 0.1400, | 0.2082, | 0.4090, |
| Amod, | 0.000, | 0.000, | 0.000, | 0.000, | 0.000, | 0.000, |
| Bmod, | 0.000, | 4.000, | 18.18, | 23.81, | 0.000, | 0.000, |
| Cmod, | 11.54, | 8.000, | 0.000, | 0.000, | 0.000, | 3.846, |
| Beta, | 5.000@ | 50.00, | 1.250@ | 50.00, | 2.500@ | 50.00, |
| Life, | 70.98@ | 19.80, | 18.61@ | 20.80, | 37.23@ | 20.60, |
| | # VRDB Summary Lot = C446G60 | | Wafer = C446G60-24 | | Test Plan = V99161B.FTM | |
| | ,P2PA 30 ms | ,300 | ,P2NWA 30 ms | ,300 | ,P2NWE 30 ms | ,300, |
| Cnt, | 26.00, | 26.00, | 26.00, | 26.00, | 25.00, | 26.00, |
| Ave, | 22.11, | 20.94, | 22.52, | 20.89, | 21.25, | 20.72, |
| Stdv, | 0.2638, | 0.3239, | 0.2234, | 0.2135, | 0.1558, | 0.1704, |
| Amod, | 0.000, | 0.000, | 0.000, | 0.000, | 0.000, | 0.000, |
| Bmod, | 0.000, | 0.000, | 0.000, | 0.000, | 0.000, | 0.000, |
| Cmod, | 0.000, | 3.846, | 0.000, | 0.000, | 0.000, | 0.000, |
| Beta, | 2.500@ | 50.00, | 1.667@ | 50.00, | 2.500@ | 50.00, |
| Life, | 37.23@ | 20.60, | 24.65@ | 20.60, | 36.73@ | 20.40, |

| | TEST PROGRAM | | | | TYPE OF CAPACITOR | 300 MILLISEC: STRESS |
|---|---|---|---|---|---|---|
| | # VRDB Summary Lot = C446G60 | | Wafer = C446G60-02 | | Test Plan = V98161B.FTM | |
| | ,P2SUBA 30 ms | ,300 | ,P2SUBE 30 ms | ,300 | ,ONO 30 ms | ,300 |
| DICE TESTED Cnt, | 25.00, | 26.00, | 25.00, | 24.00, | 24.00, | 19.00 |
| AVERAGE BV Ave, | 20.41, | 20.95, | 20.20, | 20.62, | 27.08, | 27.28 |
| STANDARD DEV. Stdv. | 0.2946, | 0.4709, | 0.2342, | 0.4347, | 0.3661, | 0.3730 |
| MODE A % Amod, | 0.000, | 0.000, | 0.000, | 0.000, | 0.000, | 0.000 |
| MODE B % Bmod, | 0.000, | 0.000, | 0.000, | 8.333, | 0.000, | 31.58 |
| MODE C % Cmod, | 0.000, | 3.846, | 0.000, | 4.167, | 4.167, | 5.263 |
| Beta, | 5.000@ | 50.00, | 80.00@ | 50.00, | 0.5000@ | 50.00 |
| Life, | 73.98@ | 20.40, | 1.191K@ | 20.40, | 10.13@ | 26.80 |
| | # VRDB Summary Lot = C446G60 | | Wafer = C446G60-05 | | Test Plan = V98161B.FTM | |
| | ,P2SUBA 30 ms | ,300 | ,P2SUBE 30 ms | ,300 | ,ONO 30 ms | ,300 |
| Cnt, | 25.00, | 26.00, | 25.00, | 26.00, | 25.00, | 26.00 |
| Ave, | 20.45, | 21.08, | 20.25, | 20.73, | 28.32, | 27.45 |
| Stdv, | 0.2136, | 0.1614, | 0.2058, | 0.1956, | 0.3527, | 0.2732 |
| Amod, | 0.000, | 0.000, | 0.000, | 0.000, | 0.000, | 0.000 |
| Bmod, | 0.000, | 0.000, | 0.000, | 0.000, | 0.000, | 0.000 |

TABLE-continued

| | | | | | | |
|---|---|---|---|---|---|---|
| Cmod, | 0.000, | 0.000, | 0.000, | 0.000, | 0.000, | 0.000 |
| Beta, | 5.000@ | 50.00, | 5.000@ | 50.00, | 0.5000@ | 50.00 |
| Life, | 75.98@ | 20.80, | 73.98@ | 20.40, | 10.23@ | 27.00 |
| | # VRDB Summary Lot = C446G60 | | Wafer = C446G60-20 | | Test Plan = V98161B.FTM | |
| | ,P2SUBA 30 ms | ,300 | ,P2SUBE 30 ms | ,300 | ,ONO 30 ms | ,300 |
| Cnt, | 25.00, | 26.00, | 25.00, | 26.00, | 23.00, | 22.00 |
| Ave, | 21.26, | 20.92, | 20.99, | 20.72, | 27.24, | 27.55 |
| Stdv, | 0.3029, | 0.4903, | 0.2347, | 0.1966, | 0.6703, | 0.3698 |
| Amod, | 0.000, | 0.000, | 0.000, | 0.000, | 0.000, | 0.000 |
| Bmod, | 0.000, | 0.000, | 0.000, | 0.000, | 4.348, | 18.18 |
| Cmod, | 0.000, | 3.846, | 0.000, | 0.000, | 4.348, | 0.000 |
| Beta, | 2.500@ | 50.00, | 80.00@ | 50.00, | @ | 50.00 |
| Life, | 37.23@ | 20.60, | 1.191K@ | 20.40, | @ | 27.00 |
| | # VRDB Summary Lot = C446G60 | | Wafer = C446G60-24 | | Test Plan = V99161B.FTM | |
| | ,P2SUBA 30 ms | ,300 | ,P2SUBE 30 ms | ,300 | ,ONO 30 ms | ,300 |
| Cnt, | 25.00, | 26.00, | 25.00, | 26.00, | 25.00, | 26.00 |
| Ave, | 21.23, | 21.06, | 20.99, | 20.72, | 29.64, | 27.62 |
| Stdv, | 0.2056, | 0.2384, | 0.2196, | 0.2407, | 0.4509, | 0.3343 |
| Amod, | 0.000, | 0.000, | 0.000, | 0.000, | 0.000, | 0.000 |
| Bmod, | 0.000, | 0.000, | 0.000, | 0.000, | 0.000, | 0.000 |
| Cmod, | 0.000, | 0.000, | 0.000, | 3.846, | 0.000, | 0.000 |
| Beta, | 5.000@ | 50.00, | 5.000@ | 50.00, | 0.5000@ | 50.00 |
| Life, | 74.98@ | 20.60, | 73.98@ | 20.40, | 10.23@ | 27.00 |

MODE A % BREAKDOWN VOLTAGES 0–2 MEG VOLT/CM
MODE B % BREAKDOWN VOLTAGES 2–8 MEG VOLT/CM
MODE C % BREAKDOWN VOLTAGES 2–8 MEG VOLT/CM $$\beta = -\frac{d \log t}{dV}$$

We claim:

1. A wafer testing system comprising:
   a network;
   at least one wafer tester, comprising an automatic test probe and a tester controller, connected to said network;
   a database connected to said network receiving test results from the at least one said wafer tester, and
   analysis software on the tester controller for processing test results to derive a predicted lifetime for each integrated circuit on a wafer being tested.

2. The wafer testing system of claim 1 in which the tester controller writes the results of a lifetime calculation to the database.

3. The wafer testing system of claim 1 in which the tester controller executes a procedure by which lifetime is determined by:
   Collecting breakdown voltages of capacitors at 2 stress conditions,
   Sorting breakdown voltages in increasing order and plotting cumulative failure percent versus breakdown voltages for each condition,
   Finding breakdown difference (ΔV) between 2 stress conditions at different failure percents,
   Finding beta values at different failure percentages where $\beta = -\frac{d \log t}{dV}$ Finding the smallest value of beta and also breakdown voltage value at 5% failure, and
   Calculate lifetime at failure rate of 5%, using:

$$\log(t) = \log 0.03 + \beta(BV_{5\%} - X),$$

where X is the operating voltage of device being tested.

4. A computer readable diskette or memory having stored thereon a computer program for implementing the system of claim 3.

5. The wafer testing system of claim 1 further comprising:
   a memory containing program commands for executing a procedure by which lifetime is determined in accordance with the following:
     measuring the peak substrate current for a fixed source to drain voltage as a function of scan gate voltage for one of an N or P channel device, and
     determining lifetime using:
       for N channel devices lifetime=A(Isub)$^{-N}$, or
       for P channel devices lifetime=A(Igate)$^{-N}$.

6. A computer readable diskette or memory having stored thereon a computer program for implementing the system of claim 5.

7. The wafer testing system of claim 1 further comprising: a plurality of wafer testers connected to the network.

8. A method of automatically testing integrated circuits fabricated on a wafer using a wafer tester comprising:
   probing selected points on each integrated circuit of a wafer to measure one or more electrical values;
   storing the values with data identifying the integrated circuit and wafer at the wafer tester;
   processing the values to produce an estimate of lifetime for the integrated circuit at the wafer tester, and
   storing the estimate of lifetime together with the values at a location remote from the wafer tester over a network.

9. A method of determining lifetime of integrated circuit components using a wafer tester, comprising the steps of:
   a. Collecting breakdown voltages of capacitors at 2 stress conditions using said wafer tester;
   b. Sorting breakdown voltages in increasing order and plotting cumulative failure percent verses breakdown voltages for each condition;
   c. Determining breakdown difference voltage between 2 stress conditions at different failure percents, d. Finding beta values at different failure percentages $$\text{where } \beta = -\frac{d \log t}{dV}$$

e. Finding the smallest value of beta and also breakdown voltage value at 5% failure, and
f. Calculating lifetime at failure rate of 5%, using:

$$\log(t) - \log 0.03 + \beta(BV_{5\%} - X),$$

where X is the operating voltage of device being tested.

10. A method of determining lifetime of integrated circuit components using a wafer tester, comprising the steps of:

a. measuring the peak substrate current for a fixed source to drain voltage as a function of scan gate voltage for one of an N or P channel device, and
determining lifetime using:
for N channel devices lifetime=$A(I_{sub})^{-N}$, or
for P channel devices lifetime=$A(I_{gate})^{-N}$.

* * * * *